United States Patent [19]
Lovrenich

[11] 4,385,791
[45] May 31, 1983

[54] ELECTRICAL ADAPTOR BLOCK

[75] Inventor: Rodger T. Lovrenich, Santa Teresa, N. Mex.

[73] Assignee: Cooper Industries, Inc., Houston, Tex.

[21] Appl. No.: 238,691

[22] Filed: Feb. 27, 1981

[51] Int. Cl.³ .................................................. H01R 9/09
[52] U.S. Cl. ................................ 339/17 C; 339/198 R; 29/840
[58] Field of Search .............. 339/17 R, 17 C, 17 CF, 339/17 L, 17 LM, 17 M, 17 LC, 198 R, 198 J; 361/400, 403, 405, 406, 409, 410, 413; 29/840, 841

[56] References Cited

U.S. PATENT DOCUMENTS 3,551,874 12/1970 Volinskie .......................... 339/17 R
3,771,101 11/1973 Elkins ............................. 339/17 C
4,007,479 2/1977 Kowalski ........................... 361/403

FOREIGN PATENT DOCUMENTS 2722736 11/1978 Fed. Rep. of Germany ...... 361/413

OTHER PUBLICATIONS

IBM Bulletin, Bardo, vol. 20, No. 1, p. 89, 6/77.

Primary Examiner—Neil Abrams
Attorney, Agent, or Firm—Brown & Martin

[57] ABSTRACT

A printed circuit board connector receptacle is positioned on the non-conductive side of a single-sided printed circuit board with its pins extending through the board and the pins are soldered to the foil on the conductive side of the board. A wire connector such as a terminal strip is positioned on the opposite or conductive side of the board, and the assembly is tilted at an angle as it is passed through a wave solder bath to solder the wire connector pins to the printed circuit board without affecting the printed circuit board connector receptacle. An adaptor block is provided that uses a single-sided printed circuit board with a wire connector on one side and a printed circuit board connector receptacle on the opposite side, both components being soldered to the same side of the board.

3 Claims, 7 Drawing Figures

ELECTRICAL ADAPTOR BLOCK

BACKGROUND OF THE INVENTION

The invention relates to an adaptor block for interconnecting wire connections, often referred to as "hard wire" connections, with a printed circuit board connector receptacle in a manner whereby servicing of the hard wire connections will not interfere with the electronic components and connections. The adaptor block can be mounted to a panel whereby the electronic components are separated from the hard wire connections by the panel. The electronic connections to the printed circuit board can be made with depluggable connectors which fit the receptacle on one side of the printed circuit board whereas wire connections are serviced on the opposite side of the printed circuit board.

The invention includes a novel method of soldering the wire connector to the same side of a single sided printed circuit board as the previously soldered connections of a printed circuit board connector receptacle which is positioned on the opposite side of the printed circuit board from the wire connector.

Single-sided printed circuit boards, printed circuit boards that have an electrically conductive foil on one side only, are preferred for use wherever possible because they are significantly less expensive than printed circuit boards which have conductive foil on both sides employing plated thru holes or soldered thru wires for making interconnection between the foil on opposite sides of the board.

It is common for manufacturers to crowd various components on the non-foil side of a single-sided printed circuit board to obtain this cost advantage. Hard wire connectors such as terminal strips are located adjacent electronic components. When a field electrician services the hard wire connections, he is working in a crowded area close to less hardy connections and components of electronic systems. The force used to engage or disengage screw connections can result in a slip of the screwdriver and the disturbance of an electronic component or connection without such disturbance being visible to the field electrician. He is working on a piece of equipment in its operating location and is not in the carefully controlled surroundings of electronic assembly in which the equipment was manufactured. He does not possess the same understanding and skills relating to the electronic hardware as those persons who manufactured and assembled the hardware.

SUMMARY OF THE INVENTION

The invention relates to adaptor block means for interconnecting hard wire connections to printed circuit board electronic connections, and the process for making said adaptor block means. The adaptor block means interconnects a hard wire connection through a printed circuit board to a printed circuit board connector receptacle which accommodates a deplugable electronic connector. The adaptor block means utilizes the less expensive single-sided printed circuit board and is arranged to conserve space. One of the connection devices, for example the printed circuit board receptacle, is positioned with its pins protruding through the connection pads of the foil on the printed circuit board. The foil side of the printed circuit board is passed through a wave solder bath and the receptacle pins are soldered to the pads.

The wire connection device, for example a screw connection terminal strip, is then positioned on the opposite side of the printed circuit board with its pins extending into connection pads on the foil side of the printed circuit board. The assembly is then tilted and is passed through the wave solder bath so that the wire connector pins and their associated pads are exposed to the solder without affecting any other components, such as the printed circuit board connector receptacle, that are already connected to the board.

It is an object of the present invention to provide a new and improved method whereby a single-sided printed circuit board with components positioned on the non-conductive side of the board can be passed through a wave solder bath to solder other components on the conductive side of the printed circuit board without affecting the first mentioned components.

It is another object of the invention to provide a new and improved method for making adaptor block means for interconnecting hard wire connections to electronic connections which is relatively simple and inexpensive and which utilizes existing technology.

It is a further object of the invention to provide new and improved adaptor block means for interconnecting hard wire connections to electronic connections which is simple and relatively inexpensive to manufacture.

It is a further object of the invention to provide such a new and improved adaptor block means utilizing a single-sided printed circuit board wherein wire connections are made on the opposite side of the adaptor block means from electronic connections and wherein both connection means are soldered to the same side of the printed circuit board.

DETAILED DESCRIPTION OF THE INVENTION

Figure 1:
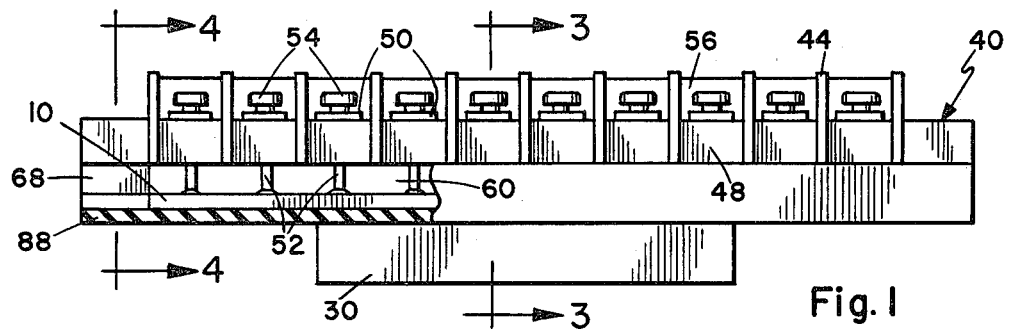
FIG. 1 is a side elevation of the adaptor block assembly of the present invention with portions cut away to show internal construction.
Figure 2:
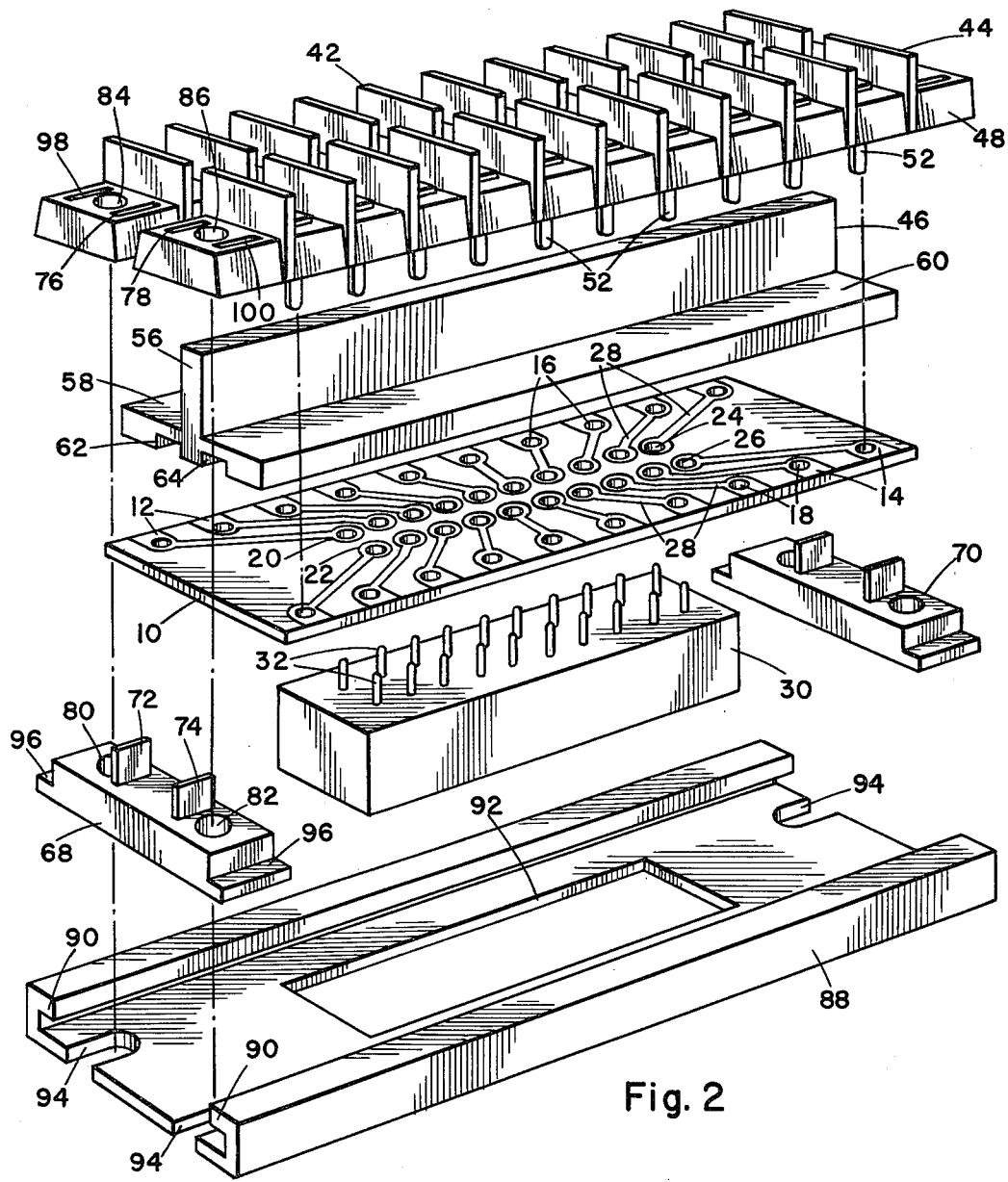
FIG. 2 is an exploded perspective view of the assembly.

Referring to the drawings, a single sided printed circuit board is shown at 10. The top of the printed circuit board includes two outer sets of aligned connection pads 12 and 14 near the edges of the board (FIG. 2). These pads are formed of an electrically conductive material, such as copper, in conventional manner and include openings 16 and 18 which pass through the printed circuit board. The pads extend to the edge of the board to provide better wicking during the soldering process. Two sets of inner aligned connection pads are provided at 20 and 22 with openings 24 and 26 therein which pass through the printed circuit board. Each outer set of connection pads is connected to the adjacent set of inner connection pads by the conductive paths 28.

A conventional printed circuit board connector receptacle is indicated at 30. This receptacle includes a body of insulating material with a plurality of metal pins 32 extending from the top. These pins are in electrical contact with female inserts 34 in the bottom of the receptacle 30. The female inserts are adapted to receive male connections from a depluggable electronic connector. This receptacle is for demonstration purposes only and any type of well known receptacle can be used.

Figure 5:
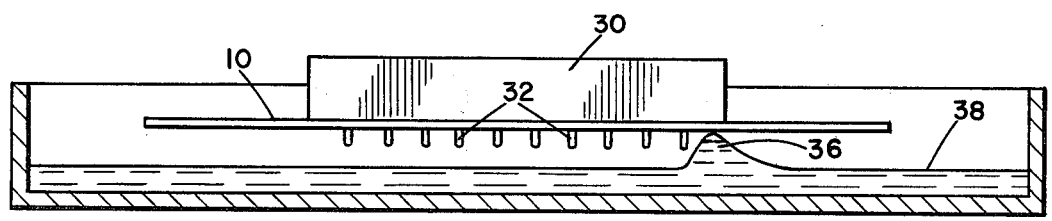
FIG. 5 is a side view showing the printed circuit board with the printed circuit board connector receptacle pins being wave soldered to the printed circuit board in a wave solder bath.

The receptacle 30 is positioned with its pins 32 extending through the openings 24 and 26 in the inner connection pads 20 and 22. The outer connection pads 12 and 14 are masked in well known fashion to prevent the holes 16 and 18 from filling with solder when the printed circuit board is first passed through a wave solder bath. The receptacle 30 and printed circuit board 10 are then passed through the wave solder bath as demonstrated in FIG. 5. The solder wave 36 from the solder bath 38 contacts the pins 22 and the inner connection pads 20 and 22. Once the pins are soldered in place, the masking is removed in well known fashion from the outer connection pads 12 and 14 on the circuit board 10.

A wire connector block 40 is next formed from an assembly comprising two electrical terminal strips 42 and 44, and a positioning block 46 formed of an insulating material such as nylon. The terminal strips are of a construction such as the 1000 Series strips manufactured by Magnum Electric Corporation of Erie, Michigan. Each terminal strip includes a plastic insulating body 48 with metal terminals 50 positioned therein, each terminal having a tail or pin 52 extending down therefrom adjacent one side of the body and a wire connection means, such as a screw 54 threaded into the top of the terminal.

The positioning block 46 has a base with an upwardly extending separator 56 which forms two platforms 58 and 60. The platforms are of such thickness that the terminal pins 52 will extend slightly below the base of the positioning block 46 and into the printed circuit board 10 without extending completely through the board. The terminal strips 42 and 44 are placed on the platform 58 and 60 with the terminal pins 52 extending alongside the positioning block 46.

Figure 6:
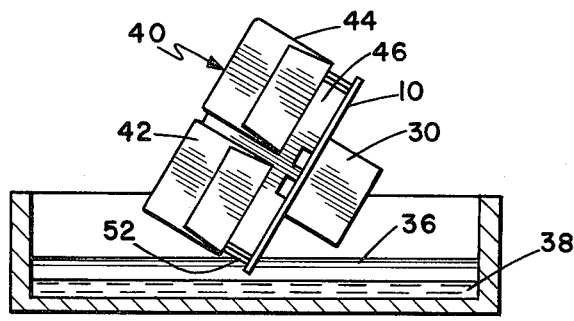
FIG. 6 is an end view showing the assembly with the wire connection device positioned on the opposite side of the printed circuit board from the receptacle and with the first set of pins of the wire connection device being wave soldered to the printed circuit board.
Figure 7:
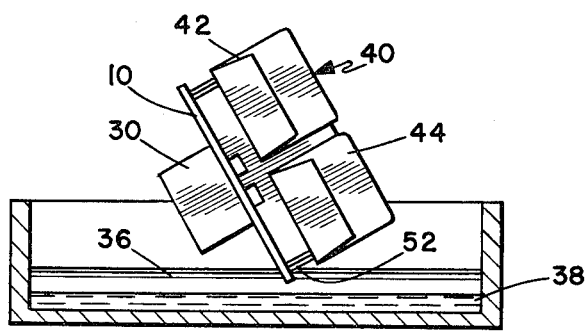
FIG. 7 is an end view showing the second set of pins of the wire connection device being wave soldered to the printed circuit board.

The positioning block 46 includes two parallel passages 62 and 64 which now fit over the pins 32 of the receptacle 30 and soldered joints 66. A single passage can be provided if desired. With the connector block 40 in place and the pins 52 extending into outer connection pads 12 and 14, the device is again ready for the wave solder bath. As shown in FIG. 6, the entire assembly is tilted at an angle as it is passed through the wave 36 of solder bath 38. The direction of movement of the assembly is into the plane of the drawing. It will be noted that by tilting the assembly, the pins 52 are soldered to the outer connection pads 12 on the printed circuit board without touching or affecting the connector receptacle 30. The assembly is next tilted in the other direction and the pins 52 are soldered to the outer pads 14 as the assembly is passed through the solder wave 36 into the plane of the drawing as shown in FIG. 7.

Figures 3, 4:
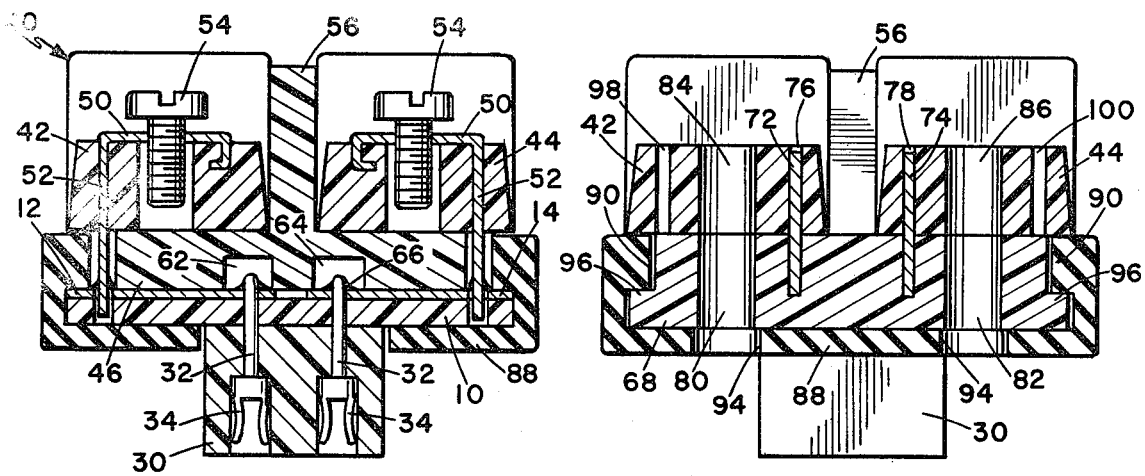
FIG. 3 is an enlarged sectional view taken on line 3—3 of FIG. 1.
FIG. 4 is an enlarged sectional view taken on line 4—4 of FIG. 1.

Next a pair of end plugs 68 and 70 are added to the assembly by inserting the blades 72 and 74 into inner slots 76 and 78 in the ends of terminal strips 42 and 44. Each end plug has holes 80 and 82 which align with holes 84 and 86 in the ends of terminal strips 42 and 44, as in FIG. 4. A flat cover 88 of pliable material such as a suitable plastic is shown in FIG. 2. The cover includes substantially channel shaped lips 90 along the sides and has a central opening 92 positioned between the lips. End slots 94 are provided in each end of the cover. The cover is applied by passing the opening 92 over the body of the printed circuit board connector receptacle 30, bending the lips 90 outward and then letting them move back into position against the shoulders 96 on the end plugs 68 and 70 and the top of the printed circuit board 10. The holes 80 and 82 in the end plug 68 align with the holes 84 and 86 in the terminal strips 42 and 44, and the end slots 94 in the end of the cover overlie these aligned openings so that the adaptor block can be affixed in place to another element such as a control panel by inserting a mechanical connector through the aligned openings. The end plug 70 on the opposite end of the assembly is affixed in position in the same manner as end plug 68. Outer slots 98 and 100 in the ends of terminal strips 42 and 44 can be used to retain cover clips for retaining a cover in position over the terminal strips if desired.

The connector block 40, which includes terminal strip 42, terminal strip 44, and positioning block 46, can be formed in one piece if desired, and the end plugs 68 and 70 can also be formed as part of this piece.

The invention has been described in the form of presently preferred embodiments. It will be appreciated by those skilled in the art that variations from these embodiments can be made without departing from the scope of this invention.

I claim:

1. Adaptor block means for electrically interconnecting wire connection means to printed circuit board connector receptacle means, comprising:

single-sided printed circuit board means having two sets of inner connection pad means positioned toward the center of the board and two sets of outer connection pad means positioned one outward from each set of said inner connection pad means toward the outer edge of said printed circuit board means, each one of said inner connection pad means being connected to one of said outer connection pad means by an electrically conductive path;

positioning block means of insulating material positioned on the same side of said printed circuit board means as said electrically conductive paths and having a base with an upwardly extending separator which forms two platforms for seating terminal strip means, said base having passage means in the bottom thereof overlying said inner connection pad means in said printed circuit board means;

a pair of terminal strip means for receiving wire connections, one terminal strip means seated on each of said platforms on said positioning block means, each of said terminal strip means having a plurality of pins protruding downwardly near one side thereof, each pin extending past the side of said platform upon which said terminal strip means is seated into one of said outer connection pad means and soldered thereto; and printed circuit board connector receptacle means positioned on the opposite side of said printed circuit board means from said positioning block means for receiving electrical connector means and having two sets of upwardly extending pins, each of said pins extending into said passage means in the bottom of said positioning block means and soldered to one of said inner connection pads.

2. Adaptor block means for electrically interconnecting wire connection means to a printed circuit board connector receptacle means according to claim 1 wherein the base of said positioning block means is of such thickness relative to the length of said terminal strip means pins that the pins extend into the said outer connection pad means but do not extend through the printed circuit board means.

3. Adaptor block means for electrically interconnecting wire connection means to printed circuit board connector receptacle means according to claim 1 and further including an end plug at each end of said adaptor block means affixed to the ends of said terminal strip means and having shoulders thereon; and a pliable cover having an opening therein through which said connector receptacle means extends, said cover having substantially channel shaped lips along the sides thereof that overlie the edges of said printed circuit board means and engage said end plug shoulders for holding said cover in place.

* * * * *